(12) United States Patent
Sorg et al.

(10) Patent No.: US 11,955,767 B2
(45) Date of Patent: Apr. 9, 2024

(54) RADIATION-EMITTING COMPONENT

(71) Applicant: OSRAM OLED GmbH, Regensburg (DE)

(72) Inventors: Jörg Erich Sorg, Regensburg (DE); David Racz, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 568 days.

(21) Appl. No.: 17/264,662

(22) PCT Filed: Aug. 1, 2019

(86) PCT No.: PCT/EP2019/070812
§ 371 (c)(1),
(2) Date: Jan. 29, 2021

(87) PCT Pub. No.: WO2020/035328
PCT Pub. Date: Feb. 20, 2020

(65) Prior Publication Data
US 2021/0313759 A1    Oct. 7, 2021

(30) Foreign Application Priority Data
Aug. 17, 2018   (DE) .................... 102018120112.5

(51) Int. Cl.
*H01S 5/022*    (2021.01)
*H01S 5/00*    (2006.01)
(Continued)

(52) U.S. Cl.
CPC ........ *H01S 5/0087* (2021.01); *H01S 5/02255* (2021.01); *H01S 5/02257* (2021.01); *H01S 5/4056* (2013.01); *H01S 5/4087* (2013.01)

(58) Field of Classification Search
CPC .............. H01S 5/0087; H01S 5/02255; H01S 5/02257; H01S 5/4056; H01S 5/4087;
(Continued)

(56) References Cited

U.S. PATENT DOCUMENTS 8,066,389 B2 * 11/2011 Silverstein ........... G02B 27/149
359/865
8,427,590 B2 * 4/2013 Raring ................. H04N 9/3129
349/5
(Continued)

FOREIGN PATENT DOCUMENTS

CN      102418905 A    4/2012
DE  102012100446 A1    9/2012
(Continued)

*Primary Examiner* — Vu A Vu
(74) *Attorney, Agent, or Firm* — Slater Matsil, LLP

(57) ABSTRACT

In an embodiment a radiation-emitting component includes a first semiconductor chip configured to generate first primary electromagnetic radiation, a second semiconductor chip configured to generate second primary electromagnetic radiation, a first conversion element configured to partially convert the first and/or the second primary electromagnetic radiation into a first secondary radiation, wherein the first semiconductor chip is a first semiconductor laser diode, wherein the first primary electromagnetic radiation is blue primary radiation and wherein the first secondary radiation is green secondary radiation and a first optical element arranged between radiation emitting surfaces of the first semiconductor chip and the second semiconductor chip, wherein the first optical element is reflective for the first primary radiation and the second primary radiation.

19 Claims, 3 Drawing Sheets

(51) Int. Cl.
*H01S 5/02255* (2021.01)
*H01S 5/02257* (2021.01)
*H01S 5/40* (2006.01)

(58) Field of Classification Search
CPC .... F21Y 2113/10; F21Y 2115/30; F21V 9/32; H01L 25/075; H01L 33/504; H01L 33/507; F21K 9/64
USPC ....................................................... 372/44.01
See application file for complete search history.

(56) References Cited

U.S. PATENT DOCUMENTS

| | | | |
|---|---|---|---|
| 8,427,749 B2* | 4/2013 | Du | H01S 5/02326 |
| | | | 359/627 |
| 8,926,109 B2 | 1/2015 | Lin | |
| 9,122,051 B2* | 9/2015 | Lin | G03B 21/2013 |
| 9,223,196 B2 | 12/2015 | Mehl | |
| 9,249,949 B2* | 2/2016 | Matsubara | F21V 13/12 |
| 9,581,313 B2* | 2/2017 | Finsterbusch | F21V 13/14 |
| 9,829,780 B2* | 11/2017 | Raring | H01S 5/4093 |
| 9,897,907 B2* | 2/2018 | Hsieh | G03B 33/08 |
| 10,283,939 B2* | 5/2019 | Dawson | H01S 5/02255 |
| 10,488,744 B2* | 11/2019 | Liao | G03B 21/147 |
| 10,833,482 B2* | 11/2020 | Chen | G02B 19/0057 |
| 2011/0176305 A1 | 7/2011 | Schallmoser | |
| 2012/0327374 A1* | 12/2012 | Kitano | G03B 21/16 |
| | | | 353/31 |
| 2013/0314896 A1 | 11/2013 | Finsterbusch | |
| 2013/0322055 A1* | 12/2013 | Sugiyama | G03B 21/204 |
| | | | 362/84 |
| 2017/0299956 A1* | 10/2017 | Holland | G02B 27/14 |
| 2017/0315431 A1* | 11/2017 | Schnarrenberger | |
| | | | G02B 27/1006 |
| 2018/0026165 A1 | 1/2018 | Bechtel et al. | |

FOREIGN PATENT DOCUMENTS

| | | |
|---|---|---|
| DE | 202014001376 U1 | 2/2014 |
| DE | 102013203572 A1 | 9/2014 |
| EP | 2834858 A1 | 2/2015 |
| EP | 2998790 A1 | 3/2016 |

\* cited by examiner

RADIATION-EMITTING COMPONENT

This patent application is a national phase filing under section 371 of PCT/EP2019/070812, filed Aug. 1, 2019, which claims the priority of German patent application 102018120112.5, filed Aug. 17, 2018, each of which is incorporated herein by reference in its entirety.

TECHNICAL FIELD

A radiation-emitting component is specified.

SUMMARY

Embodiments provide a radiation-emitting component which has a particularly high luminance.

A radiation-emitting component is specified emitting electromagnetic radiation, in particular visible light, during operation.

According to at least one embodiment, the radiation-emitting component comprises a first radiation-emitting semiconductor chip configured to generate a first primary electromagnetic radiation and a second radiation-emitting semiconductor chip configured to generate a second primary electromagnetic radiation. For example, the first radiation emitting semiconductor chip generates the first primary radiation that is different from the second primary radiation generated by the second radiation emitting semiconductor chip. This is to say that the two radiation-emitting semiconductor chips then generate primary radiation in different wavelength ranges from one another, for example, light of different colors.

Furthermore, it is possible that the first primary radiation is equal to the second primary radiation.

For example, the first and the second primary radiation can be near-ultraviolet radiation, visible light and/or near-infrared radiation.

At least one of the semiconductor chips can be, for example, a surface emitter in which the emitted radiation mostly, for example, over 80% of the radiation power, exits from a radiation emitting surface formed by a major surface of the first radiation emitting semiconductor chip or by a major surface of the second radiation emitting semiconductor chip.

At least one of the semiconductor chips can, for example, be a side surface emitter, in which the emitted radiation exits mostly, for example over 80% of the radiation power, from a radiation emitting surface which is enclosed by a side surface of the first radiation-emitting semiconductor chip and/or by a side surface of the second radiation-emitting semiconductor chip. For example, each of these extends transversely to the main surface of the associated radiation emitting semiconductor chip.

Furthermore, at least one of the semiconductor chips can be a volume-emitting semiconductor chip which emits the emitted primary radiation not only from a single main surface but also from the side surface. For example, in the case of the volume emitter, at least 30% of the radiation power of the emitted radiation exits through the side surface.

At least one of the semiconductor chips can be arranged on at least one mounting element. In this case, at least one of the semiconductor chips is preferably arranged with an electrical contact in an electrically conductive manner on the at least one mounting element. The at least one mounting element contains, for example, a metal or consists, for example, of a metal. For example, the at least one mounting element comprises or consists of one of the following materials: copper tungsten, silicon carbide or aluminum nitride.

The first radiation emitting semiconductor chip and the second radiation emitting semiconductor chip can be arranged on a carrier. In particular, the at least one mounting element can be arranged on the carrier.

For example, the carrier has a main extension plane. The vertical direction extends perpendicular to the main extension plane and the lateral directions extend parallel to the main extension plane. Preferably, the first semiconductor chip and the second semiconductor chip are spaced apart from one another in lateral directions.

Further, the carrier can be in electrically conductive contact with the first radiation emitting semiconductor chip and the second radiation emitting semiconductor chip. The carrier is or comprises, for example, a metallic and/or ceramic material. The carrier is or comprises, for example, a circuit board or a leadframe.

According to at least one embodiment, the radiation emitting component comprises a first conversion element partially converting the first and/or the second primary electromagnetic radiation into a first secondary radiation. The first conversion element comprises phosphor particles configured to convert a portion of the first and/or the second primary radiation into a first secondary radiation. That is to say that the phosphor particles can each convert first and/or second primary electromagnetic radiation into first secondary electromagnetic radiation of a different wavelength range. In particular, the first secondary radiation can comprise longer wavelengths than the first and the second primary radiation. For example, the first and the second primary electromagnetic radiations are blue or ultraviolet light. For example, the first electromagnetic secondary radiation can be green, yellow or red light.

The first conversion element comprises, for example, a matrix material into which the phosphor particles are incorporated. The matrix material can be, for example, a resin, such as an epoxy or a silicone or a mixture of these materials, or a ceramic material. The phosphor particles provide the conversion layer with the length wave converting properties.

For example, one of the following materials is suitable for the phosphor particles: rare earth doped garnets, rare earth doped alkaline earth sulphides, rare earth doped thiogallates, rare earth doped aluminates, rare earth doped silicates, rare earth doped orthosilicates, rare earth-doped chlorosilicates, rare earth-doped alkaline earth silicon nitrides, rare earth-doped oxynitrides, rare earth-doped aluminium oxynitrides, rare earth-doped silicon nitrides, rare earth-doped sialons, quantum dots. These materials can also be used without matrix material. The first conversion element can then be formed from or consist of one of the materials.

According to at least one embodiment, the first radiation emitting semiconductor chip is a semiconductor laser diode. The semiconductor laser diode emits during operation primary electromagnetic radiation, such as monochromatic and coherent laser light. The laser light is preferably coupled out from the side surface of the semiconductor laser diode. The side surface of the semiconductor laser diode is preferably perpendicular to the first mounting surface.

According to at least one embodiment, the first primary electromagnetic radiation is blue primary radiation. The blue primary radiation is in particular blue light. A peak wavelength of the blue primary radiation is preferably between 400 nm and 490 nm inclusive.

According to at least one embodiment, the first secondary radiation is a green secondary radiation. In particular, the first conversion element partially converts the blue primary radiation into green secondary radiation. In particular, the green secondary radiation is green light. A peak wavelength of the green secondary radiation is preferably between 490 nm and 580 nm inclusive.

Alternatively, it is possible that the first conversion element partially converts the blue primary radiation into yellow or other colored secondary radiation.

In at least one embodiment, the radiation-emitting component comprises a first radiation emitting semiconductor chip configured to generate a first primary electromagnetic radiation and a second radiation emitting semiconductor chip configured to generate a second primary electromagnetic radiation, a first conversion element partially converting the first and/or the second primary electromagnetic radiation into a first secondary radiation, wherein the first radiation emitting semiconductor chip is a first semiconductor laser diode, the first primary electromagnetic radiation is blue primary radiation and the first secondary radiation is green secondary radiation.

One idea of the radiation-emitting component described herein is, among other things, to use semiconductor lasers in, for example, a flash light application. By using a semiconductor laser, high luminance levels can advantageously be generated on an object to be exposed.

According to at least one embodiment, the second electromagnetic primary radiation is a red primary radiation. The red primary radiation is in particular red light. A peak wavelength of the red primary radiation is preferably between 610 nm and 780 nm inclusive. For example, the first primary radiation, the second primary radiation and the first secondary radiation can mix to form white mixed light. For example, the white mixed light thus comprises spectral components of red, green and blue light.

According to at least one embodiment, the first semiconductor chip is a first edge-emitting semiconductor laser chip emitting the first primary radiation from a first side surface during operation. For example, the first edge-emitting semiconductor laser chip is configured to emit the laser radiation generated in operation in a direction parallel to an active radiation generating zone of the first semiconductor laser chip. The first side surface of the first semiconductor laser chip thereby forms a first radiation emitting surface.

The first radiation emitting surface is oriented, for example, perpendicularly or transversely to the main extension plane of the active zone of the first semiconductor laser chip, which extends in lateral directions. Transversely means that the facet can have a slope due to manufacturing and can for example have a deviation of ±5° from a plane perpendicular to the main surface.

According to at least one embodiment, the second semiconductor chip is a second edge-emitting semiconductor laser chip or a radiation-emitting light-emitting diode. For example, if the second semiconductor chip is a second edge-emitting semiconductor laser chip, the second edge-emitting semiconductor laser chip is configured to emit the laser radiation generated during operation in a direction parallel to an active radiation generating zone of the second semiconductor laser chip extending in lateral directions.

If the second semiconductor chip is a light emitting diode, it can be a surface emitter or volume emitter as described above.

According to at least one embodiment, the second semiconductor chip has a second radiation emitting surface from which the second primary radiation is emitted during operation. If the second semiconductor chip is a second edge-emitting semiconductor laser chip, the second edge-emitting semiconductor laser chip emits primary radiation from a second side surface during operation. The second side surface of the second semiconductor laser chip thereby forms a second radiation emitting surface. The second radiation emitting surface is oriented, for example, perpendicular or transverse to the main extension plane of the active zone of the second semiconductor laser chip.

In the case that the second semiconductor chip is a light emitting diode, it can for example be a surface emitter. In this case, the second radiation emitting surface is for example formed by the major surface of the second semiconductor chip.

According to at least one embodiment, the first side surface of the first semiconductor chip is arranged opposite the second radiation emitting surface of the second semiconductor chip. The first side surface or the first radiation emitting surface is arranged perpendicular or transverse to the main extension plane. Furthermore, the second side surface or the second radiation emitting surface is arranged perpendicular or transverse to the main extension plane. The side surfaces or the radiation emitting surfaces are spaced apart from one another and are opposite one another.

According to at least one embodiment, a second conversion element is arranged on the second radiation emitting surface of the second semiconductor chip. For example, the second conversion element is arranged directly on the second semiconductor chip and is in direct contact therewith.

The second conversion element comprises, for example, a matrix material in which phosphor particles are incorporated which are configured to convert a portion of the second primary radiation into a second secondary radiation. This is to say that the phosphor particles can each convert second primary electromagnetic radiation into secondary electromagnetic radiation of a different wavelength range. In particular, the second secondary radiation can comprise longer wavelengths than the second primary radiation. For example, the second primary electromagnetic radiation is blue or ultraviolet light. For example, the second electromagnetic secondary radiation can be green, yellow or red light.

In particular, the matrix material and the phosphor particles of the second conversion element can comprise or be formed from the materials mentioned in connection with the first conversion element.

According to at least one embodiment, the second conversion element partially converts the second primary electromagnetic radiation into second secondary radiation and the second secondary radiation is a red secondary radiation. In particular, the second conversion element partially converts the blue primary radiation into red secondary radiation. In particular, the red secondary radiation is red light. A peak wavelength of the red secondary radiation is preferably between 650 nm and 750 nm inclusive.

According to at least one embodiment, the second secondary radiation has a broadened emission spectrum compared to the second primary radiation. For example, if the second semiconductor chip is the second edge-emitting semiconductor laser chip, the emitted first and second primary radiation generally exhibit an emission spectrum. The emission spectrum can be graphically represented by plotting a spectral intensity or spectral luminous flux of the primary radiation emitted by the semiconductor chip as a function of wavelength. Thus, the emission spectrum is represented by a curve in which the wavelength is plotted on the x-axis and the spectral intensity or the spectral luminous flux is plotted on the y-axis.

Furthermore, the emission spectrum has a maximum and a full width at half maximum. The term full width at half maximum refers to the curve of the emission spectrum with the maximum, wherein the full width at half maximum is the region on the x-axis corresponding to the two y-values corresponding to half of the emission maximum.

Preferably, the emission spectrum of the first edge-emitting semiconductor laser chip and the second edge-emitting semiconductor laser chip, respectively the first primary radiation and the second primary radiation, has a full width at half maximum less than or equal to 10 nm. The red secondary radiation converted by the second conversion element also has an emission spectrum. A full width at half maximum of the emission spectrum of the red secondary radiation is preferably greater than or equal to 50 nm.

According to at least one embodiment, a first optical element is arranged between the first semiconductor chip and the second semiconductor chip, the first optical element being reflective for the first primary radiation and the second primary radiation or the second secondary radiation. Preferably, the first optical element has a reflectivity for the first primary radiation and the second primary radiation or the second secondary radiation of at least 90%. Through the optical element, the first primary radiation and the second primary radiation or the second secondary radiation are directed from the respective radiation emitting surfaces, which are preferably opposite one another, onto the first conversion element.

According to at least one embodiment, the first semiconductor chip and the second semiconductor chip are arranged within a housing having a recess on a top surface opposite to the semiconductor chips. The recess completely penetrates the top surface and preferably extends in lateral directions. Furthermore, the recess is arranged in the housing such that a major part of the first primary radiation and the second primary radiation and/or second secondary radiation can pass through the recess by means of the first optical element.

According to at least one embodiment, the first conversion element is arranged on or in the recess and completely covers or closes the recess. For example, the first conversion element projects beyond the recess in lateral directions. In this case, the first conversion element can be arranged on an outer surface of the housing facing away from or facing the semiconductor chips and close the recess. Alternatively, the conversion element can be arranged to accurately fitting within the recess. In this case, an outer surface of the first conversion element facing away from and facing the semiconductor chips terminates flush with the outer surface of the housing facing away from and facing the semiconductor chips.

The first primary radiation and second primary radiation or second secondary radiation deflected by means of the first optical element can thus preferably be partially converted by the first conversion element.

According to at least one embodiment, the radiation emitting component comprises a second conversion element partially converting the second electromagnetic primary radiation into second secondary radiation. Further, the second secondary radiation is a red secondary radiation. The second conversion element thereby comprises the same properties as the second conversion element described above.

According to at least one embodiment, the second radiation emitting semiconductor chip is a second semiconductor laser diode which, during operation, generates second primary radiation having a different polarisation from the first primary radiation generated by the first semiconductor laser diode. The first primary radiation and the second primary radiation are electromagnetic waves propagating along a propagation direction. For example, the electromagnetic wave can oscillate in different spatial directions. The polarisation or the direction of polarisation indicates in which direction this electromagnetic wave oscillates in relation to the propagation direction. This is to say that the electromagnetic wave that can be associated with the first and the second primary radiation each oscillates in a different spatial direction.

According to at least one embodiment, the first primary radiation is a first linearly polarised blue primary radiation and the second primary radiation is a second linearly polarised blue primary radiation. The first radiation emitting surface and the second radiation emitting surface are preferably arranged parallel to one another. This is to say that the first radiation emitting surface and the second radiation emitting surface do not face one another, but lie in a common plane. For example, the first primary radiation can have a polarisation that is parallel or perpendicular to the propagation direction of the second primary radiation. In particular, the perpendicular or parallel polarisation does not change during an unobstructed propagation.

According to at least one embodiment, a polarisation of the first linearly polarised blue primary radiation is tilted by 90° relative to a polarisation of the second linearly polarised blue primary radiation. For example, if the first linearly polarised blue primary radiation has a polarisation that is perpendicular to its propagation direction, the polarisation of the second linearly polarised blue primary radiation is also perpendicular to its propagation direction, but is substantially perpendicular to the polarisation of the first linearly polarised blue primary radiation. Substantially perpendicular means that the polarisation of the second linearly polarised blue primary radiation has a deviation of at most 5° from a plane perpendicular to the polarisation of the first linearly polarised blue primary radiation and perpendicular to its propagation direction.

For example, the first semiconductor chip and the second semiconductor chip are configured to emit linearly polarised primary blue radiation with the same polarisation in operation. Preferably, the 90° tilt of polarisation can be achieved by a 90° tilt of one of the two semiconductor chips. For example, the first and second semiconductor chips are respectively mounted on a first and a second mounting element. Preferably, the first mounting element is mounted on the carrier with a major surface. The second mounting element is then applied to the carrier with a side surface perpendicular to the main surface of the first mounting element.

According to at least one embodiment, a polarisation coupler is arranged downstream of the first semiconductor chip and the second semiconductor chip. The polarisation coupler comprises, for example, at least one reflective mirror which is reflective for the first linearly polarised blue primary radiation or the second linearly polarised blue primary radiation. Further, the polarisation coupler comprises, for example, at least one semi-transparent mirror that is transmissive for the first linearly polarised blue primary radiation and reflective for the second linearly polarised blue primary radiation or reflective for the first linearly polarised blue primary radiation and transmissive for the second linearly polarised blue primary radiation. "Downstream" means that the polarisation coupler is arranged relative to the semiconductor chips such that the primary radiation from the semiconductor chips can pass through it. For this purpose, at least one optical element can be arranged between the semiconductor chips and the polarisation coupler, which guides the primary radiation of the semiconductor chips to the polarisation coupler, for example, by means of reflection and/or refraction.

According to at least one embodiment, the polarisation coupler is configured to superimpose the first linearly polarised blue primary radiation and the second linearly polarised blue primary radiation. The resulting polarised blue primary radiation is a superposition of the first linearly polarised blue primary radiation and the second linearly polarised blue primary radiation. Advantageously, an energy density can be increased in this way.

According to at least one embodiment, the second conversion element is arranged between the first conversion element and the semiconductor chips. Preferably, the second conversion element is arranged between the first conversion element and the polarisation coupler.

According to at least one embodiment, the second conversion element is arranged in a plane with the first conversion element. Preferably, in this case a radiation splitter is arranged downstream of the polarisation coupler so that polarised blue primary radiation coupled out of the polarisation coupler can be directed to the second conversion element and the first conversion element.

According to at least one embodiment, the second conversion element comprises a first region and a second region. The first region can have the shape of a cylinder. For example, the second region surrounds an outer surface of the first region. This is to say that an outer surface of the cylinder of the first region can be completely surrounded by the second region.

According to at least one embodiment, the first region is configured to transmit the first and the second primary radiation, and the second region is configured to partially convert the first and the second primary radiation into red secondary radiation. The first region can be a recess. By means of a size of the cross-sectional area of the first region and a size of the cross-sectional area of the second region, the ratio of transmitted first and second primary radiation to converted red secondary radiation can thus be adjusted. Furthermore, the heating of the second region can be limited by the size of the first region. During operation of the radiation-emitting component, the second region can heat up considerably. Since no primary radiation is converted to red secondary radiation in the first region, the heating of the second conversion element can be limited. Furthermore, the first region can also be formed by means of a radiation-transmitting material, for example, with a transparent or translucent material, i.e. a material that is transparent or partially transparent for the primary radiation and does not cause any conversion into red secondary radiation.

According to at least one embodiment, the first region is arranged in the center of the second conversion element and is surrounded by the second region. For example, the first conversion element can have the shape and size of the first region of the second conversion element and can be arranged downstream thereof. The transmitted first and second primary radiation can preferably be partially converted into green secondary radiation by the first conversion element.

According to at least one embodiment, a color filter is arranged between the second conversion element and the semiconductor chip. Preferably, the color filter is arranged between the second conversion element and the polarisation filter. In particular preferably, the filter can be arranged directly on the second conversion element. A radiation entrance surface of the color filter facing away from the second conversion element can be covered at least in places with an anti-reflective coating. Furthermore, a transparent heat sink can be arranged between the anti-reflective coating and the color filter. The heat sink is formed of sapphire, for example.

Additionally or alternatively, a further color filter can be arranged on a radiation entrance surface of the first conversion element.

According to at least one embodiment, the color filter is a dichroic color filter configured to transmit only blue primary radiation. If the color filter is arranged on the second conversion element, it transmits blue primary radiation so that only the blue primary radiation can be converted by the second conversion element. This advantageously increases an optical efficiency of the radiation emitting component. If a further color filter is arranged on the radiation entrance surface of the first conversion element, it is configured to transmit blue primary radiation and red secondary radiation.

Preferably, the color filter and the further color filter are formed by a layer sequence. For example, the layer sequence comprises layers with a low refractive index, such as $SiO_2$, and layers with a high refractive index, such as $TiO_2$, $NiO_{10}$ or $TaO_{10}$.

According to at least one further embodiment, the first conversion element and the second conversion element are arranged in a support with which a beam path of the first and second primary radiation and the first and second secondary radiation is adjustable. The support is preferably reflective for the first and second primary radiation and has a reflectivity for said radiation of at least 90%. Preferably, a major part of said radiation is thus directed to the first and the second conversion element.

According to at least one embodiment, a second optical element is arranged downstream of the first conversion element. By means of the second optical element, the converted first and second secondary radiation and the transmitted first and second primary radiation can be shaped and/or redirected.

According to at least one embodiment, primary radiation and secondary radiation mix to a warm white mixed light. For example, the primary radiation and the secondary radiation are mixed in the first conversion element. The relative proportions of the first primary radiation, the second primary radiation and the first secondary radiation or the first primary radiation, the second secondary radiation and the first secondary radiation thus control the chromaticity coordinate and the color temperature of the mixed radiation, so that a warm white mixed light can be produced by mixing said radiations.

According to at least one embodiment, the luminance of the mixed light is between 400 and 1300 $cd/mm^2$. Due to the use of at least one semiconductor laser diode, the luminance is comparatively high, so that the radiation-emitting component can advantageously be used in flash applications.

Furthermore, a radiation-emitting component is disclosed comprising only a first radiation emitting semiconductor chip configured to generate first primary electromagnetic radiation. All features and embodiments disclosed in connection with the first radiation-emitting semiconductor chip described above are also applicable in connection with the first radiation-emitting semiconductor chip described herein and vice versa.

Further, the radiation-emitting component comprises a first conversion element partially converting the first primary electromagnetic radiation into a green secondary radiation and a second conversion element partially converting the first primary electromagnetic radiation into a red secondary radiation, wherein the first radiation emitting semiconductor chip is a first semiconductor laser diode, and the first primary electromagnetic radiation is blue primary radiation. Further, all features and embodiments disclosed in connection with the previously described conversion elements are also applicable in connection with the first conversion element and second conversion element described herein and vice versa.

BRIEF DESCRIPTION OF THE DRAWINGS

In the following, the radiation emitting component described herein will be explained in more detail with reference to exemplary embodiments and the associated figures.

Identical, similar or similarly acting elements are marked with the same reference signs in the figures. The figures and the proportions of the elements shown in the figures to one another are not to be regarded as true to scale. Rather, individual elements can be oversized for better representability and/or comprehensibility.

DETAILED DESCRIPTION OF ILLUSTRATIVE EMBODIMENTS

Figure 1:
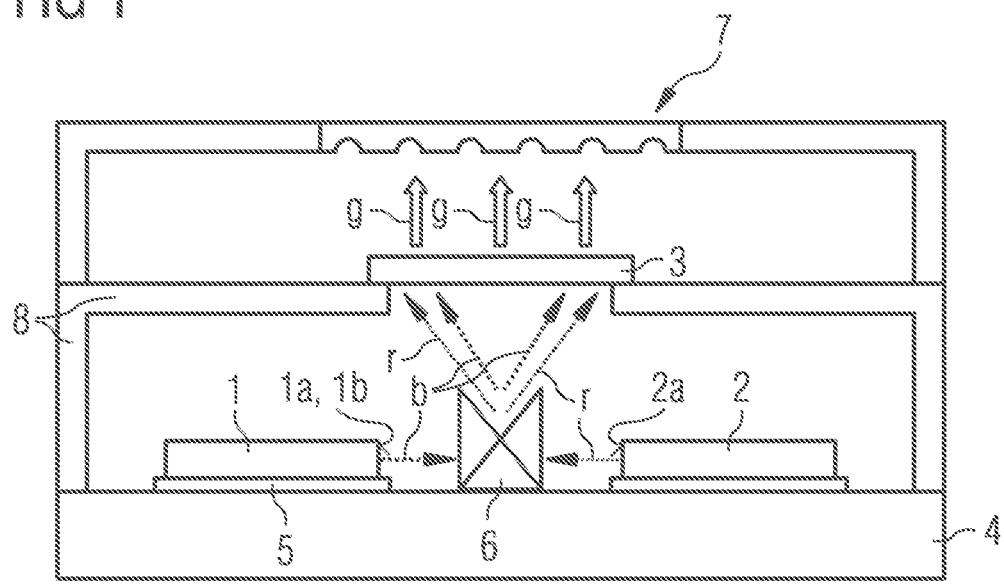
FIG. 1 shows a schematic sectional view of a radiation emitting component according to an exemplary embodiment.

FIG. 1 shows a schematic sectional view of an optoelectronic component according to an exemplary embodiment.

The optoelectronic component according to the exemplary embodiment shown in FIG. 1 comprises a first semiconductor chip 1 and a second semiconductor chip 2, which are respectively a first and a second edge-emitting semiconductor chip. By means of a first and a second mounting element 5, the first and the second semiconductor chip 1, 2 are arranged on a carrier 4. The first and second primary radiation generated during operation exits from a first side surface 1b or a first radiation emitting surface 1a of the first semiconductor chip 1 and a second side surface 2b or a second radiation emitting surface 2a of the second semiconductor chip 2, respectively. The first radiation emitting surface 1a faces the second radiation emitting surface 2a. Further, the first primary radiation is blue primary radiation b and the second primary radiation is red primary radiation r.

The first semiconductor chip 1 and the second semiconductor chip 2 are surrounded by a housing which has a recess on a top surface opposite the semiconductor chips. The recess is covered by a first conversion element as shown in FIG. 1. Via a first optical element 6, the blue primary radiation b and the red primary radiation r are reflected towards the first conversion element 3. The dotted arrows indicate the directions of propagation of the blue and the red primary radiation b, r. Furthermore, the first conversion element 3 is configured to convert the blue primary radiation b into green secondary radiation g.

A second optical element 7 is arranged downstream of the first conversion element 3. Through the second optical element 7, the green secondary radiation g and the transmitted blue and red primary radiation b, r can be formed.

Figure 2:
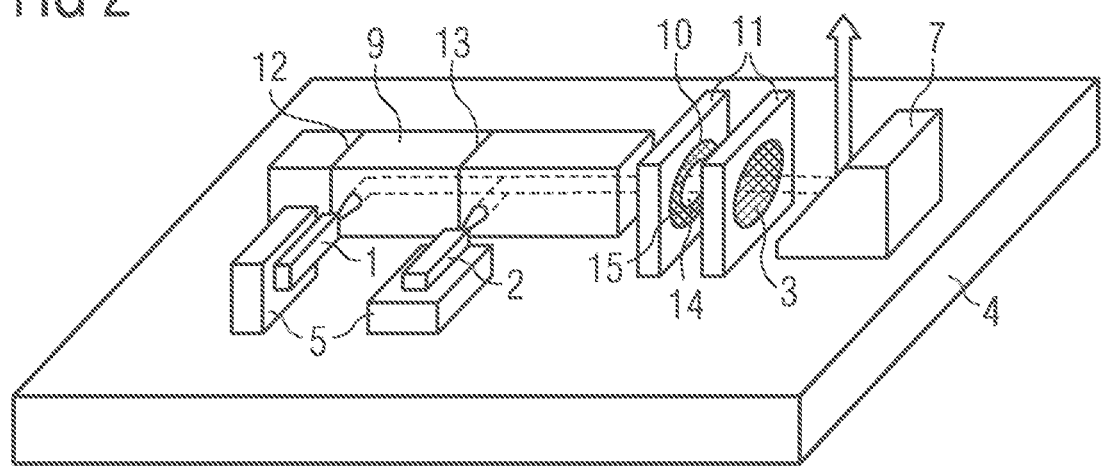
FIG. 2 shows a schematic representation of a radiation emitting component according to an exemplary embodiment.

According to FIG. 2, a schematic representation of an optoelectronic component according to a further exemplary embodiment is shown.

As shown in FIG. 2, the first semiconductor chip 1 and the second semiconductor chip 2 are each mounted on a mounting element 5. In contrast to the exemplary embodiment according to FIG. 1, the first and second radiation emission surfaces do not face one another, but lie in a common plane. The mounting element 5 of the second semiconductor chip 2 is tilted by 90° relative to the mounting element 5 of the first semiconductor chip 1. By means of such an arrangement, a polarisation of a first linearly polarised blue primary radiation of the first semiconductor chip 1 is tilted by 90° with respect to a polarisation of a second linearly polarised blue primary radiation of the second semiconductor chip 2.

The first and the second linearly polarised blue primary radiation subsequently enter a polarisation coupler 9. The first linearly polarised blue primary radiation is reflected at a reflecting mirror 12 towards a semi-transparent mirror 13 through which it can pass. Furthermore, the second linearly polarised blue primary radiation is reflected at the semi-transparent mirror 13. This results in a superposition of the first linearly polarised blue primary radiation and the second linearly polarised blue primary radiation.

The optoelectronic component comprises a second conversion element 10 arranged between the first conversion element 3 and the polarisation coupler 9. Further, the second conversion element 10 comprises a first region 14 and a second region 15. The second region 15 of the second conversion element 10 converts a portion of the blue primary radiation into red secondary radiation, wherein a portion of the blue primary radiation is not converted by the first region 14 of the second conversion element 10. This portion of the blue primary radiation subsequently impinges unconverted on the first conversion element 3 and is partially converted into green secondary radiation. The blue primary radiation, the red secondary radiation and the green secondary radiation can be mixed in the first conversion element 3. Subsequently, the blue primary radiation, the red secondary radiation and the green secondary radiation or the mixed light can be redirected at the second optical element 7.

The first and the second conversion element 3, 10 are arranged in a support 11 with which a beam path of the first and second primary radiation and the first and second secondary radiation can be adjusted.

Figure 3:
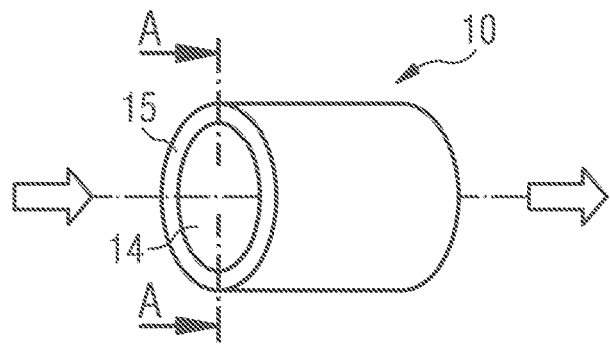
FIG. 3 shows a schematic representation of a conversion element according to an exemplary embodiment.

According to FIG. 3, a schematic representation of a conversion element according to an exemplary embodiment is shown.

The second conversion element 10 according to the exemplary embodiment of FIG. 3 comprises the first region 14 and the second region 15. The first region 14 has the shape of a cylinder. A circumferential surface of the cylinder of the first region 14 is completely surrounded by the second region 15.

Figure 4:
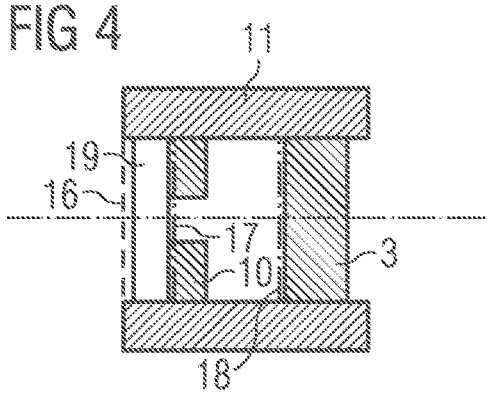
FIG. 4 shows a schematic sectional view of conversion elements of a radiation emitting component according to an exemplary embodiment.

The schematic sectional view of conversion elements of a radiation emitting component according to the exemplary embodiment of FIG. 4 shows the first and the second conversion element 3, 10, which are arranged in a support 11. The second conversion element 10 has the structure shown in FIG. 3. A color filter 17 is arranged on a radiation entrance surface of the second conversion element 10. Furthermore, a further color filter 18 is arranged on a radiation entrance surface of the first conversion element 3.

The second conversion element 10 and the color filter 17 can be arranged on a transparent heat sink 19, which has an anti-reflective coating 16 on a radiation entrance surface.

Figure 5:
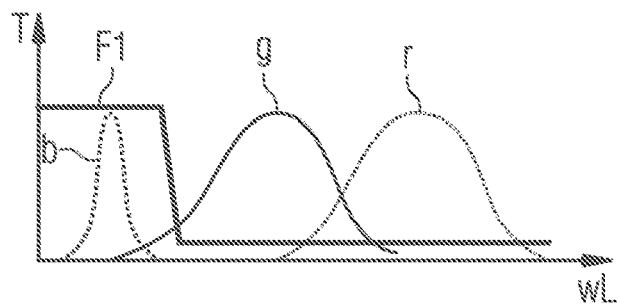
FIGS. 5 and 6 show schematic filter diagrams each according to one exemplary embodiment.
Figure 6:
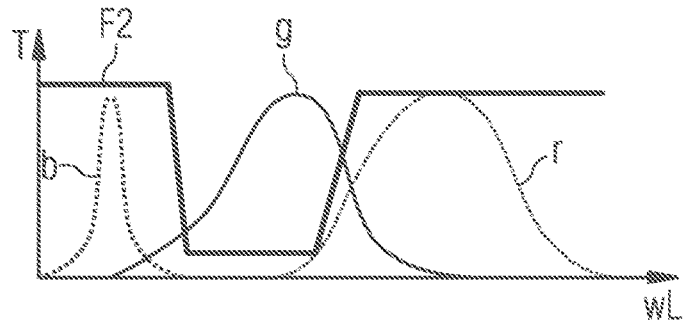

The embodiments of FIGS. 5 and 6 show schematic color filter diagrams of the color filter (FIG. 5) and the further color filter (FIG. 6).

According to FIG. 5, a transmission T in % is plotted over a wavelength wL in nanometres. The curves b, g and r are typical emission spectra of a semiconductor laser emitting blue primary radiation b, and of converted red and green secondary radiation r, g. A filter curve F1 indicates which spectral components are transmitted by the color filter 17. Here, mainly the blue primary radiation b is transmitted.

In contrast to the exemplary embodiment of FIG. 5, a further filter curve F2 is shown in FIG. 6, which indicates the transmitted spectral components from the further color filter 18. Here, mainly the blue primary radiation b and the red secondary radiation r are transmitted. A major part of the green secondary radiation g is reflected.

Figure 7:
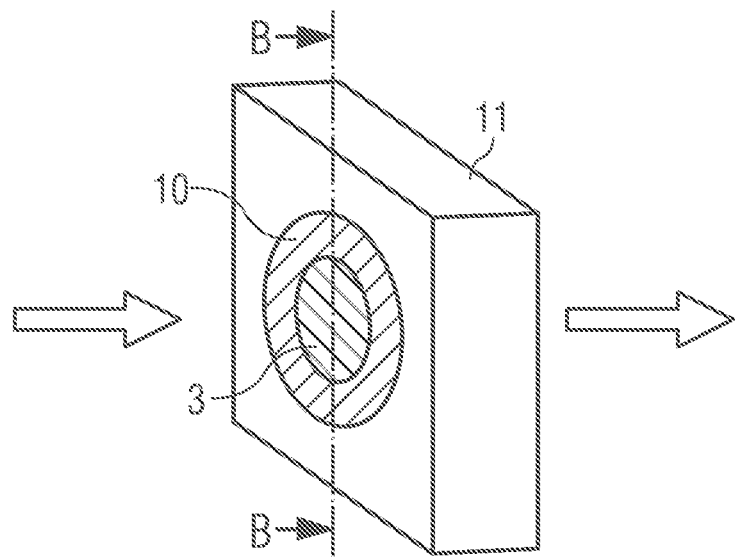
FIGS. 7 and 8 show schematic representations of conversion elements of a radiation emitting component according to a further exemplary embodiment.
Figure 8:
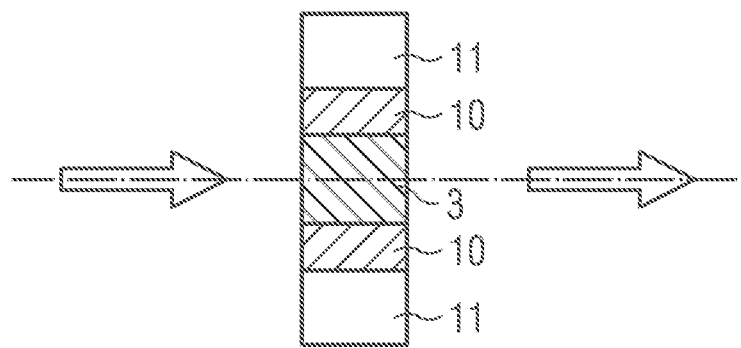

According to FIG. 7, a schematic representation of conversion elements of a radiation emitting component according to a further exemplary embodiment is shown. The schematic sectional view according to FIG. 8 shows a section along the line B-B of FIG. 7. Here, the second conversion element 10 is arranged in a plane with the first conversion element 3. The first conversion element 3 has the shape of a cylinder. The second conversion element 10 surrounds an outer surface of the first conversion element 3, so that the first conversion element 3 is completely enclosed by the second conversion element 10. The first and second conversion elements 3, 10 are arranged in a support 11. The support 11 completely encloses the second conversion element 10. The first and second conversion elements 3, 10 are arranged in the radiation emitting component in such a way that primary radiation impinges on the first and second conversion elements 3, 10 from the left side.

The invention is not limited to the exemplary embodiments by the description based thereon. Rather, the invention encompasses any new feature as well as any combination of features, which in particular includes any combination of features in the patent claims, even if this feature or combination itself is not explicitly indicated in the patent claims or exemplary embodiments.

The invention claimed is:

1. A radiation-emitting component comprising:
a first semiconductor chip configured to generate a first primary electromagnetic radiation;
a second semiconductor chip configured to generate a second primary electromagnetic radiation;
a first conversion element configured to partially convert the first primary electromagnetic radiation and/or the second primary electromagnetic radiation into a first secondary radiation,
wherein the first semiconductor chip is a first semiconductor laser diode,
wherein the first primary electromagnetic radiation is blue primary radiation, and wherein the first secondary radiation is green secondary radiation; and
a first optical element arranged between radiation emitting surfaces of the first semiconductor chip and the second semiconductor chip,
wherein the first optical element is configured to reflect the first primary radiation and the second primary radiation.

2. The radiation-emitting component according to claim 1, wherein the second primary electromagnetic radiation is red primary radiation.

3. The radiation-emitting component according to claim 1, wherein the first semiconductor chip is a first edge-emitting semiconductor laser chip configured to emit the first primary radiation from a first side surface.

4. The radiation-emitting component according to claim 3,
wherein the second semiconductor chip is a second edge-emitting semiconductor laser chip or a light-emitting diode,
wherein the second semiconductor chip has a second radiation emitting surface configured to emit the second primary radiation, and
wherein the first side surface of the first semiconductor chip is arranged opposite the second radiation emitting surface of the second semiconductor chip.

5. The radiation-emitting component according to claim 4,
wherein the second semiconductor chip is the second edge-emitting semiconductor laser chip,
wherein a second conversion element is arranged on the second radiation emitting surface of the second semiconductor chip,
wherein the second conversion element is configured to partially convert the second primary electromagnetic radiation into second secondary radiation, and
wherein the second secondary radiation is red secondary radiation and has a broadened emission spectrum compared to the second primary radiation.

6. The radiation-emitting component according to claim 1, wherein the first optical element is reflective for the second secondary radiation.

7. The radiation-emitting component according to claim 1,
wherein the first semiconductor chip and the second semiconductor chip are arranged within a housing having a recess on a top surface opposite to the first and second semiconductor chips, and
wherein the first conversion element is arranged on or in the recess and completely covers or closes the recess.

8. The radiation-emitting component according to claim 1, further comprising:
a second conversion element configured to partially convert the second primary electromagnetic radiation into second secondary radiation,
wherein the second secondary radiation is red secondary radiation, and
wherein the second semiconductor chip is a second semiconductor laser diode configured to emit the second primary radiation having a different polarisation from the first primary radiation.

9. The radiation-emitting component according to claim 8,
wherein the first primary radiation is a first linearly polarised blue primary radiation and the second primary radiation is a second linearly polarised blue primary radiation, and wherein a polarisation of the first linearly polarised blue primary radiation is tilted 90° relative to a polarisation of the second linearly polarised blue primary radiation.

10. The radiation-emitting component according to claim 8, further comprising a polarisation coupler arranged downstream of the first semiconductor chip and the second semiconductor chip, wherein the polarisation coupler is configured to superimpose the first linearly polarised blue primary radiation and the second linearly polarised blue primary radiation.

11. The radiation-emitting component according to claim 8, wherein the second conversion element is arranged between the first conversion element and the first and second semiconductor chips.

12. The radiation-emitting component according to claim 8, wherein the second conversion element is arranged in a plane with the first conversion element.

13. The radiation-emitting component according to claim 8,
wherein the second conversion element comprises a first region and a second region,
wherein the first region is configured to transmit the first and second primary radiation, and
wherein the second region is configured to partially convert the first and second primary radiation into red secondary radiation.

14. The radiation-emitting component according to claim 13, wherein the first region is arranged at a center of the second conversion element and is surrounded by the second region.

15. The radiation-emitting component according to claim 8, further comprising a color filter arranged between the second conversion element and the first and second semiconductor chips, wherein the color filter is a dichroic color filter configured to transmit only blue primary radiation.

16. The radiation-emitting component according to claim 1, further comprising a second optical element arranged downstream of the first conversion element.

17. The radiation-emitting component according to claim 1,
wherein the radiation-emitting component is configured to generate white mixed light, and
wherein a luminance of the white mixed light is between 400 and 1300 cd/mm$^2$.

18. A radiation-emitting component comprising:
a first semiconductor chip configured to generate first primary electromagnetic radiation;
a first conversion element configured to partially convert the first primary electromagnetic radiation into green secondary radiation; and
a second conversion element configured to partially convert the first primary electromagnetic radiation into red secondary radiation,
wherein the first semiconductor chip is a first semiconductor laser diode,
wherein the first primary electromagnetic radiation is blue primary radiation, and
wherein the second conversion element completely surrounds an outer surface of the first conversion element.

19. A radiation-emitting component comprising:
a first semiconductor chip configured to generate a first primary electromagnetic radiation;
a second semiconductor chip configured to generate a second primary electromagnetic radiation;
a first conversion element configured to partially convert the first primary electromagnetic radiation and/or the second primary electromagnetic radiation into a first secondary radiation; and
a second conversion element configured to partially convert the second primary electromagnetic radiation into second secondary radiation,
wherein the first semiconductor chip is a first semiconductor laser diode,
wherein the second semiconductor chip is a second semiconductor laser,
wherein the first primary electromagnetic radiation is blue primary radiation,
wherein the first secondary radiation is green secondary radiation,
wherein the second secondary radiation is red secondary radiation,
wherein the second primary radiation has a different polarisation than the first primary radiation,
wherein the first primary radiation is a first linearly polarised blue primary radiation and the second primary radiation is a second linearly polarised blue primary radiation, and
wherein a polarisation of the first linearly polarised blue primary radiation is tilted 90° relative to a polarisation of the second linearly polarised blue primary radiation.

* * * * *